(12) United States Patent
Keller

(10) Patent No.: US 6,320,372 B1
(45) Date of Patent: *Nov. 20, 2001

(54) APPARATUS AND METHOD FOR TESTING A SUBSTRATE HAVING A PLURALITY OF TERMINALS

(75) Inventor: Timothy J. Keller, San Jose, CA (US)

(73) Assignee: Electroglas, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/350,510

(22) Filed: Jul. 9, 1999

(51) Int. Cl.⁷ .............................. G01R 1/04; G01R 31/02
(52) U.S. Cl. ........................................ 324/158.1; 324/758
(58) Field of Search ................................ 324/158.1, 754, 324/758

(56) References Cited

U.S. PATENT DOCUMENTS

| | | | |
|---|---|---|---|
| 4,786,867 | * 11/1988 | Yamatsu | 324/758 |
| 5,172,053 | * 12/1992 | Itoyama | 324/758 |
| 5,410,259 | * 4/1995 | Fujihara et al. | 324/758 |
| 5,422,579 | * 6/1995 | Yamaguchi | 324/758 |
| 5,510,723 | * 4/1996 | Canella et al. | 324/758 |
| 5,751,157 | * 5/1998 | Kister | 324/758 |
| 5,804,983 | 9/1998 | Nakajima et al. | |
| 6,096,567 | * 8/2000 | Kaplan et al. | 438/14 |

* cited by examiner

Primary Examiner—Safet Metjahic
Assistant Examiner—Jermele M. Hollington
(74) Attorney, Agent, or Firm—Blakely, Sokoloff, Taylor & Zafman

(57) ABSTRACT

The invention provides apparatus for testing a substrate having a plurality of terminals. The apparatus includes a frame, a first arrangement secured to the frame, a mounting arrangement secured to the frame, and a second arrangement secured to the mounting arrangement. One of the first and second arrangements is a holder capable of holding the substrate so that the terminals are located in the first plane. The other one of the first and second arrangements is a probe card including a probe card backing member and a plurality of probes extending from the probe card backing member, the probes having contact regions located in a second plane. The mounting apparatus includes at least a first member which is adjustable relative to the frame so as to pivot the second arrangement relative to the first arrangement between an orientation wherein there is an angle between the first and second planes and an orientation wherein the first and second planes are substantially parallel to one another. The first and second arrangements are movable relative to one another between a position wherein the contact regions are spaced from the terminals and a position wherein each contact region contacts a respective one of the terminals.

24 Claims, 11 Drawing Sheets

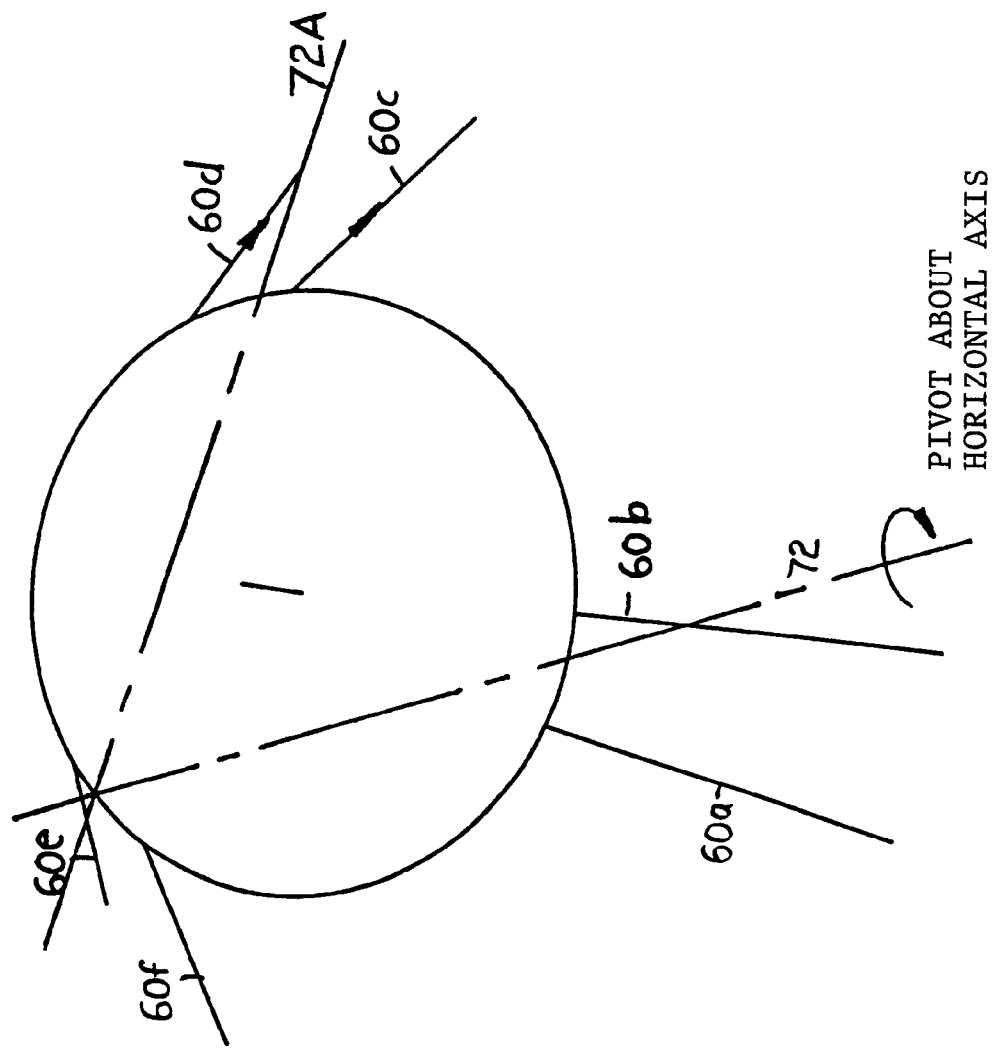

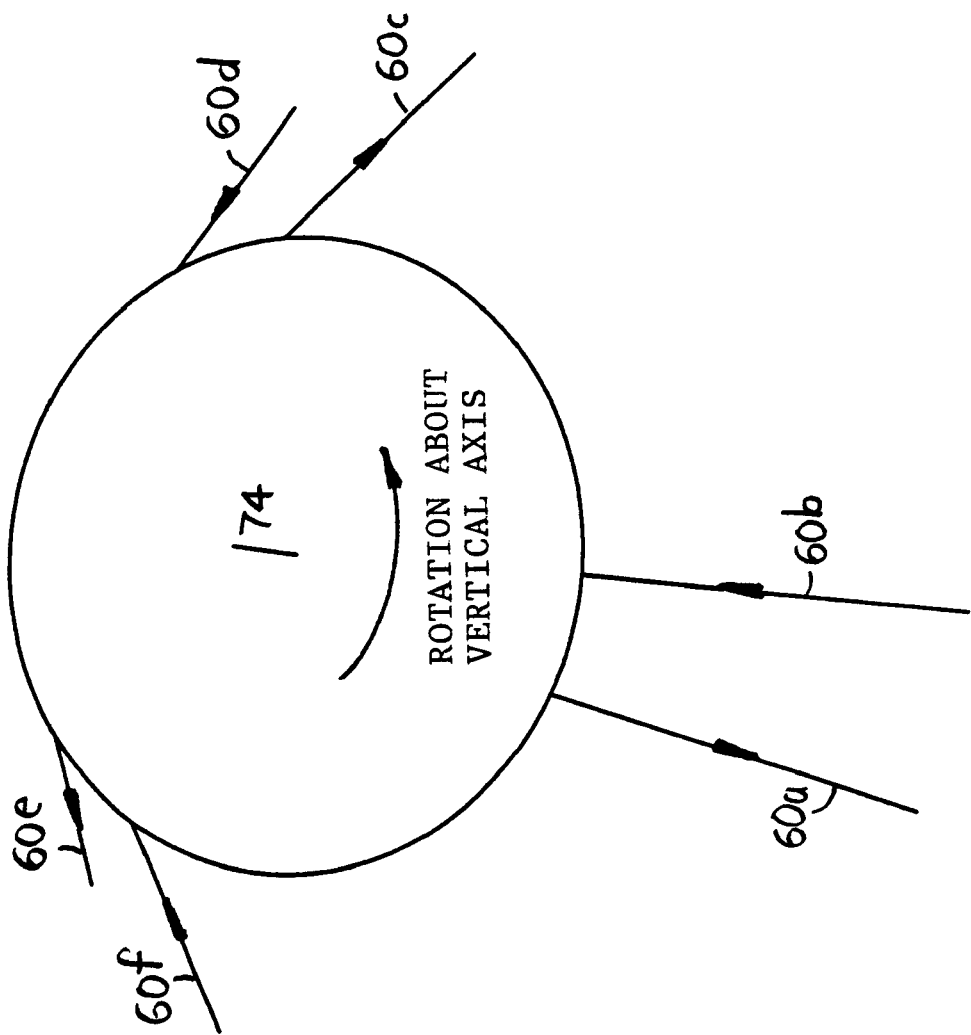

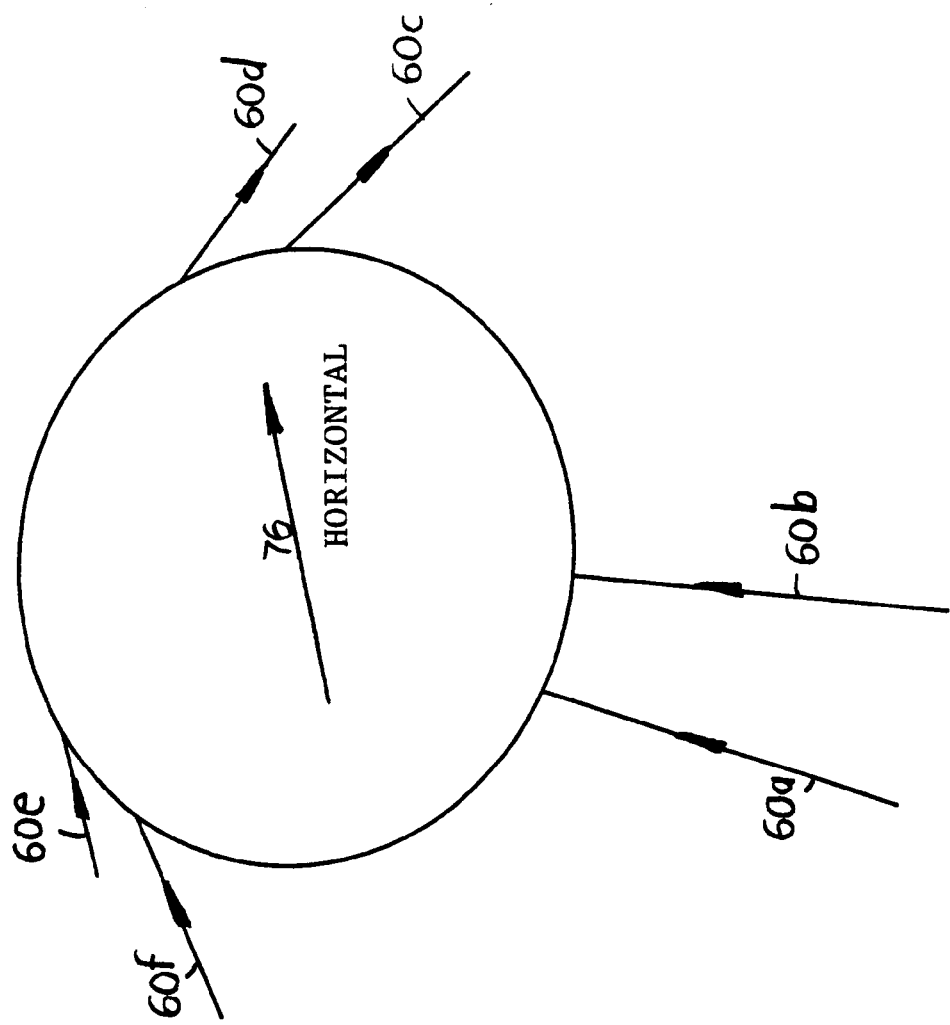

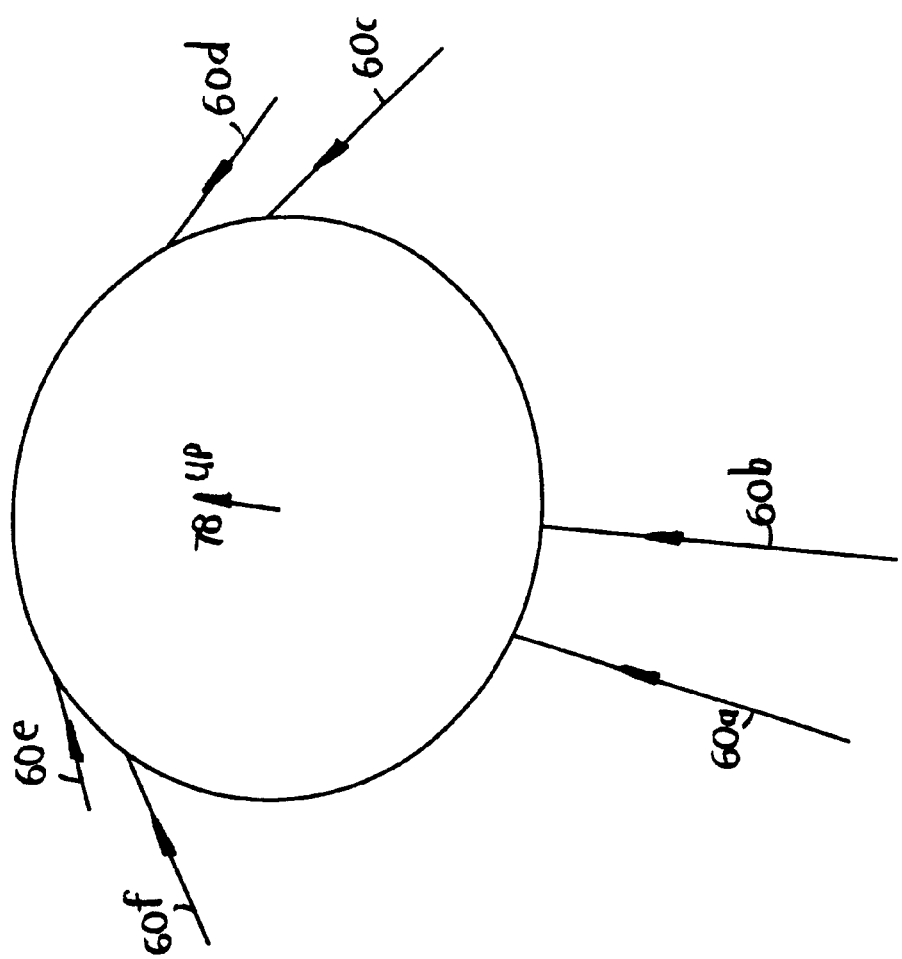

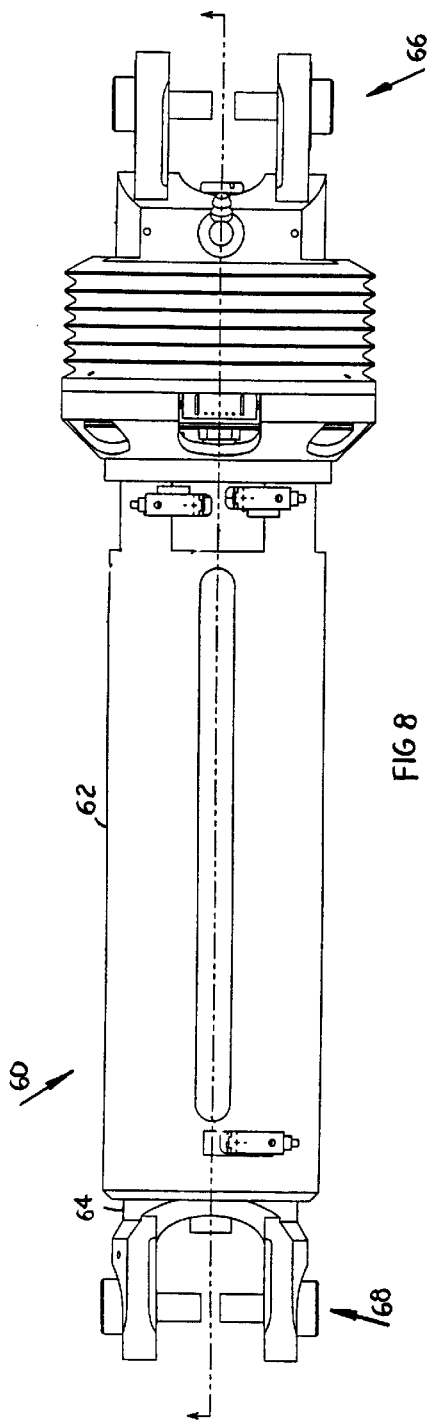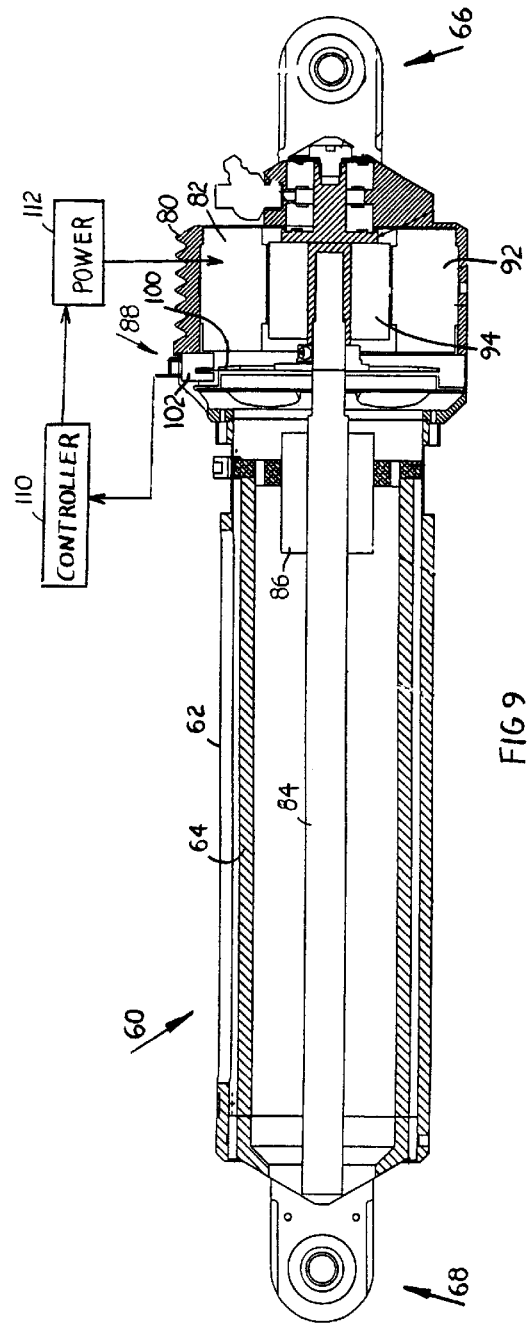

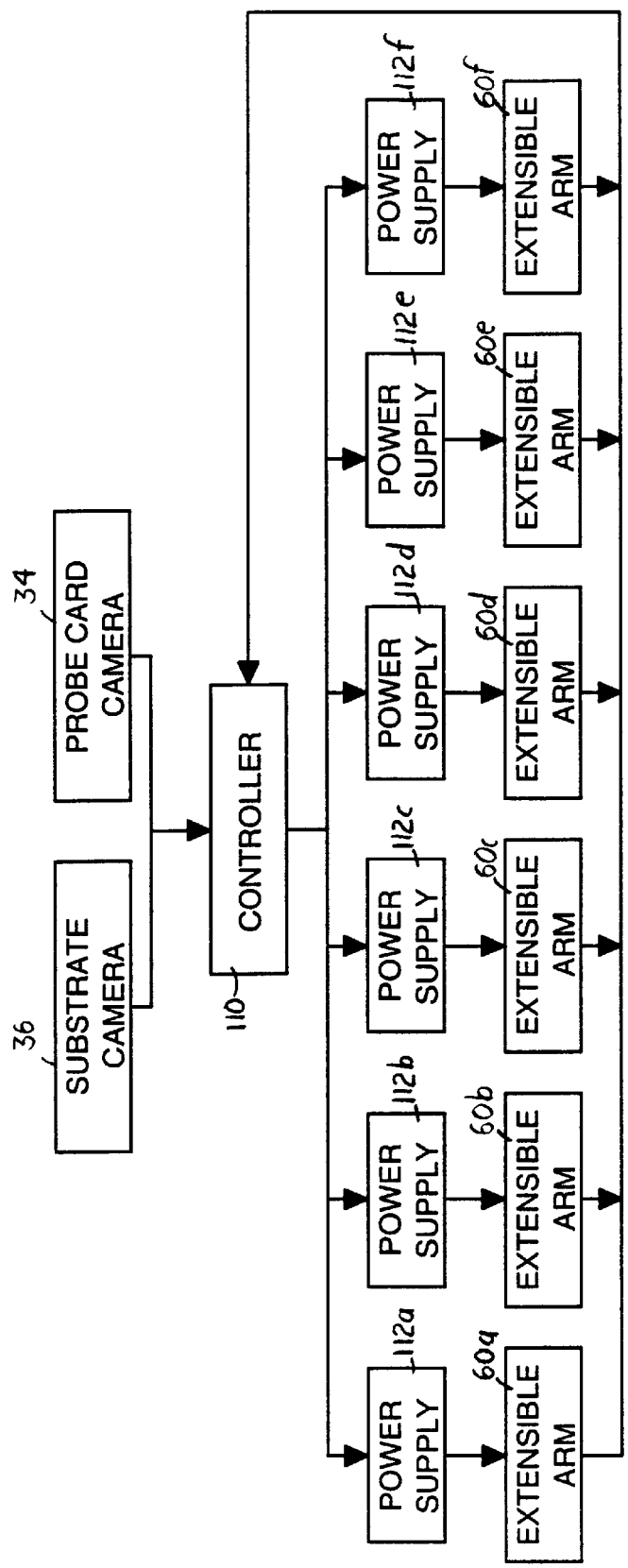

APPARATUS AND METHOD FOR TESTING A SUBSTRATE HAVING A PLURALITY OF TERMINALS

BACKGROUND OF THE INVENTION

1). Field of the Invention

This invention relates to an apparatus for testing a substrate having a plurality of terminals, and to a method of testing a substrate having a plurality of terminals.

2). Discussion of Related Art

Electronic circuits are often made by manufacturing a plurality of electronic devices such as transistors, capacitors, diodes, etc. in and on a semiconductor wafer. The devices are interconnected with one another in an integrated circuit by metal lines that are deposited on the wafer. A plurality of terminals are formed on a surface of the wafer and are connected to the metal lines. Electric signals can be provided to or received from the integrated circuit through the terminals.

A number of the integrated circuits are usually formed in and on a single wafer. The integrated circuits are located in the form of dice in rows and columns on the wafer. The wafer is subsequently sawed so that the dice are singulated from one another.

Before the wafer is sawed, the integrated circuit of each die is tested for defects. A probe card having a plurality of probes is used for making an electrical connection to the terminals. Each probe has a contact region which contacts a respective one of the terminals. The probes are connected to an electrical tester. The electrical tester provides signals through the probes and the terminals to the integrated circuit, and receives signals from the integrated circuit through the terminals and the probes.

Due to many factors, some of which are discussed hereinbelow, proper contact between the probes and the terminals is often difficult to obtain. Contact regions of the probes may, for example, be located in one plane and the terminals may be located in another plane which is not parallel to the plane of the contact regions. When the terminals and the contact regions are moved into engagement with the terminals, some probes may create more force on some terminals than others. In more extreme situations proper contact between a probe and a terminal is not provided. Other problems such as rotational or positional misalignment may also occur.

SUMMARY OF THE INVENTION

The invention provides an apparatus for testing a substrate having a plurality of terminals. The apparatus includes a frame, a first arrangement secured to the frame, a mounting arrangement secured to the frame, and a second arrangement secured to the mounting arrangement. One of the first and second arrangements is a holder capable of holding the substrate so that the terminals are located in the first plane. The other one of the first and second arrangements is a probe card including a probe card backing member and a plurality of probes extending from the probe card backing member, the probes having contact regions located in a second plane. The mounting apparatus includes at least a first member which is adjustable relative to the frame so as to pivot the second arrangement relative to the first arrangement between an orientation wherein there is an angle between the first and second planes and an orientation wherein the first and second planes are substantially parallel to one another. The second arrangement is movable relative to the frame between a position wherein the contact regions are spaced from the terminals and a position wherein each contact region contacts a respective one of the terminals.

The apparatus preferably includes a controller which receives a signal indicating an orientation of the first plane while the second arrangement is moved towards the position wherein each contact region contacts a respective one of the terminals. The controller controls the first member so as to maintain the orientation of the first plane parallel to the orientation of the second plane while the second arrangement is moved towards the position wherein each contact region contacts a respective one of the terminals.

The second arrangement preferably pivots about a first axis and the mounting arrangement preferably further includes at least a second member which is adjustable relative to the frame so as to pivot the second arrangement, relative to the first arrangement, about a second axis which is at an angle relative to the first axis, between an orientation wherein there is an angle between the first and second planes and an orientation wherein the first and second planes are substantially parallel to one another.

The apparatus may further include a member which is adjustable so as to rotate the second arrangement relative to the first arrangement without necessarily changing an angle between the first and second planes.

The mounting arrangement may move the second arrangement towards the first arrangement so as to bring the contact regions into contact with the terminals.

The apparatus may further include an electrical tester within communication with the probes so as to be capable of testing the substrate by providing electrical signals through the probes and the terminals to the substrate.

The apparatus may further include at least one detector capable of detecting the location of the first plane, and detecting the location of the second plane. A controller may form part of the apparatus and may receive information from the detector of the locations of the first and second planes. The controller may be capable of adjusting the first member relative to the frame so as to adjust the first and second planes relative to one another between the orientation wherein there is an angle between the first and second planes and the orientation wherein the first and second planes are substantially parallel.

The first arrangement is preferably the probe card and the second arrangement is preferably the holder.

The invention also provides an apparatus for testing a substrate having a plurality of terminals, the apparatus including a frame, a probe card, a mounting arrangement, and a holder. The probe card is secured to the frame and has a probe card backing member and a plurality of probes extending from the probe card backing member. The probes have contact regions located in a first plane. The mounting arrangement includes at least a first member which is adjustable relative to the frame so as to pivot the holder relative to the frame between a first orientation wherein there is an angle between the first and second planes and an orientation wherein the first and second planes are substantially parallel to one another. The probe card and the holder are movable relative to one another between a position wherein the contact regions are spaced from the terminals and a position wherein each contact regions contacts a respective one of the terminals.

The holder may be movable relative to the frame between the position wherein the contact regions are spaced from the terminals and the position wherein each contact region contacts a respective one of the terminals.

The invention also provides an apparatus for testing a substrate having a plurality of terminals. The apparatus includes a frame, a first arrangement secured to the frame, a plurality of members secured to the frame, each member being adjustable relative to the frame, and a second arrangement secured to the members. One of the first and second arrangements is a holder capable of holding the substrate so that the terminals are located in a first plane. The other one of the first and second arrangements is a probe card including a probe card backing member and a plurality of terminals extending from the probe card backing member, the probes having contact regions located in a second plane. The members are selectively adjustable so as to be capable of pivoting the second arrangement about a first axis between an orientation wherein there is an angle between the first and second planes and an orientation wherein the first and second planes are substantially parallel to one another, pivoting the second arrangement about a second axis, which is at an angle relative to the first axis, between an orientation wherein there is an angle between the first and second planes and an orientation wherein the first and second planes are substantially parallel to one another, rotating the second arrangement without necessarily changing an angle between the planes, moving the second arrangement so that the first and second planes move past one another in a first direction, moving the second arrangement so that the first and second planes move past one another in a second direction which is transverse to the first direction, and moving the second arrangement towards and away from the first arrangement without necessarily changing an angle between the planes.

Each member is preferably an extensible arm.

At least six extensible arms may be provided.

Extension of all the arms may cause movement of the second arrangement towards the first arrangement.

Preferably, the first arrangement is the probe card and the second arrangement is the holder.

The apparatus may further include an electrical tester which is in communication with the probes so as to be capable of testing the substrate by providing electrical signals through the probes and the terminals to the substrate.

The apparatus may further include at least one detector capable of detecting the location of the first plane and capable of detecting the location of the second plane. A controller may form part of the apparatus and is capable of recieving information from the detector of the locations of the first and second planes. The controller is capable of adjusting the first member relative to the frame so as to adjust the first and second planes relative to one another between the orientation wherein there is an angle between the first and second planes and the orientation wherein the first and second planes are substantially parallel.

The invention also provides an apparatus for testing a substrate having a plurality of terminals, including a frame, a first arrangement, six extensible arms, and a second arrangement. The first arrangement is secured to the frame. Each one of the six extensible arms has a first end secured to the frame for pivotal movement in more than one direction. The second arrangement is secured to second ends, opposing the first ends, of each of the six extensible arms, for pivotal movement in more than one direction relative to each respective arm. One of the first arrangement and the second arrangement is a holder capable of holding the substrate. The other one of the first arrangement and the second arrangement is a probe card including a probe card backing member and a plurality of probes extending from the backing member. The members are selectively adjustable so as to be capable of moving the second arrangement relative to the first arrangement. The first and second arrangements are movable relative to one another between a position wherein contact regions of the probes are spaced from the terminals, and a position wherein each one of the contact regions contacts a respective one of the terminals.

The invention also provides an apparatus for testing a substrate having a plurality of terminals, including a frame, a first arrangement secured to the frame, six extensible arms, each arm having a first end secured to the frame for pivotal movement in more than one direction, a second arrangement secured to second ends, opposing the first ends, of each of the six extensible arms for pivotal movement in more than one direction relative to each respective arm, at least one detector, and a controller. One of the first and second arrangements is a holder capable of holding the substrate so that the terminals are located in a first plane, and the other one of the first and second arrangements is a probe card including a probe card backing member and a plurality of probes extending from the probe card backing member. The probes have contact regions located in a second plane. The members are selectibly adjustable relative to one another so as to be capable of pivoting the second arrangement about a first axis between an orientation wherein there is an angle between the first and second planes and an orientation wherein the first and second planes are substantially parallel to one another, pivoting the second arrangement about a second axis, which is at an angle relative to the first axis, between an orientation wherein there is an angle between the first and second planes and an orientation wherein the first and second planes are substantially parallel to one another, rotating the second member without necessarily changing an angle between the planes, moving the second arrangement so that the first and second planes move past one another in a first direction, moving the second arrangement so that the first and second planes move past one another in a second direction which is transverse to the first direction, and moving the second arrangement towards and away from the first arrangement without necessarily changing an angle between the planes. The detector is capable of detecting the location of the first plane and the location of the second plane. The controller receives data from the detector of the location of the first and second planes. The controller is capable of controlling the six extensible arms so that the extensible arms pivot the second arrangement so as to position the first and second planes parallel to one another, rotate the first and second planes relative to one another, move the first and second planes past one another so as to position a selected group of the terminals over the probes, the rotation ensuring alignment between selected ones of the probes and selected ones of the terminals, and the pivoting ensuring that the probes are substantially equidistantly spaced from the terminals, and moving the first and second planes toward one another so that a respective one of the contact regions contacts a respective one of the terminals.

The invention also provides a method of testing a substrate having a plurality of terminals. The method includes moving a member, thereby pivoting a probe card and the substrate relative to one another between an orientation wherein there is an angle between a first plane in which contact regions of the probe cards are located and a second plane in which the terminals are located, and an orientation wherein the first and second planes are substantially parallel to one another, and again moving the member thereby moving the probe card and the substrate towards one another until each contact region contacts a respective one of the terminals.

The method may further include rotating the probe card and the substrate relative to one another. The probe card and the substrate may be rotated relative to one another without changing an angle between the planes.

The method may further include moving the probe card and the substrate past one another in a first direction.

The method may further include moving the probe card and the substrate past one another in a second direction which is transversed to the first direction.

BRIEF DESCRIPTION OF THE DRAWINGS

The invention is further described by way of example with reference to the accompanying drawings wherein:

FIG. 4 is a perspective view illustrating how the holder can be pivoted about a horizontal axis;

FIG. 5 is a perspective view illustrating how the holder can be rotated about a vertical axis;

FIG. 6 is a perspective view illustrating how the holder can be moved in a horizontal direction;

FIG. 7 is a perspective view illustrating how the holder can be elevated;

FIG. 8 is a side view illustrating one extensible arm formning part of the mounting arrangement;

FIG. 9 is a sectioned side view of the extensible arm;

FIG. 10 is a block diagram illustrating control features of the apparatus;

DETAILED DESCRIPTION OF THE INVENTION

Figure 1:
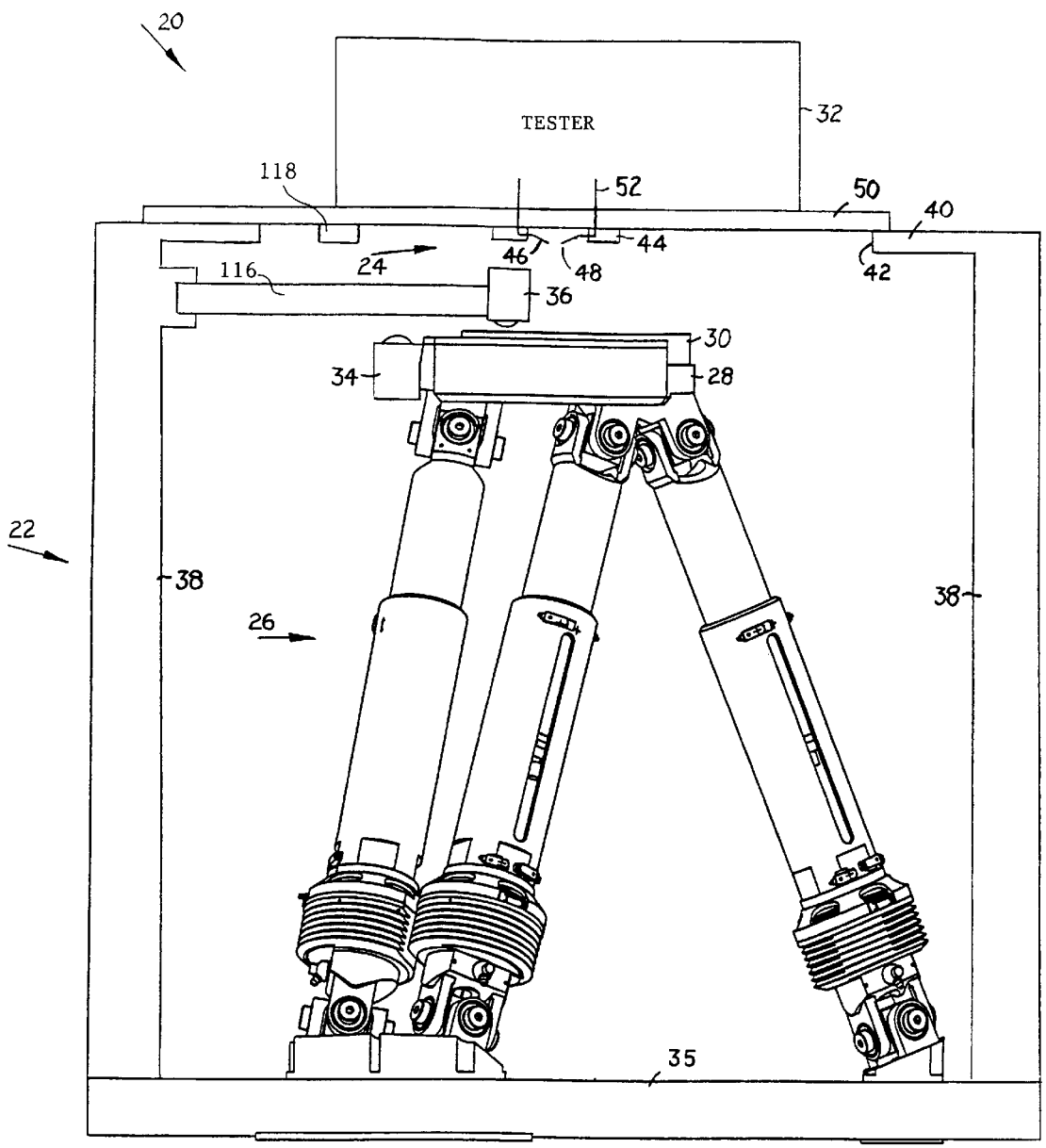
FIG. 1 is a side view illustrating an apparatus, according to an embodiment of the invention, which is used for testing a substrate having a plurality of terminals.

FIG. 1 of the accompanying drawings illustrates an apparatus 20, according to an embodiment of the invention, which is used for testing a substrate having a plurality of terminals. The apparatus 20 includes a frame 22, a probe card 24, a hexapodal mounting arrangement 26, a support plate 28, a holder 30, an electrical tester 32, a probe card camera 34, and a substrate camera 36.

The frame 22 includes a base plate 35, pillars 38, and a shelf 40. The base plate 35 is located in a stationary position on a floor. Each pillar 38 has a lower end secured to the base plate 35 and extends upwardly therefrom. The shelf 40 is secured to upper ends of the pillars 38. An opening 42 is formed in a central region of the shelf 40.

The probe card 24 includes a probe card backing member 44 and probes 46 which are secured to the probe card backing member 44. Each probe 46 has a contact region 48 at a tip thereof which is slightly lower than a lower surface of a probe card backing member 44. Each probe 46 can bend under spring action so that the contact region 48 thereof can be depressed against spring action.

The probe card backing member 44 is secured to a lower surface of a mounting plate 50. The electrical tester 32 is secured on top of the mounting plate 50. An electrical wire 52 interconnects a respective one of the probes 46 with the electrical tester 32. Although only two electrical wires 52 are shown, it should be understood that there may be hundreds of probes 46 and a large number of wires may be provided so as to interconnect the probes 46 with the electrical tester 32. The electrical wires 52 may for example be in a bundle which is about 15 centimeters in diameter. Because of the large number of electrical wires 52, the pro be card 24 is preferably maintained stationary.

The mounting plate 50 is located on top of the shelf 40 with the probe card 24 located within the opening 42. The mounting plate 50 is then secured to the shelf 40.

The contact regions 48 of the probes 46 are usually located within the same plane. However, the plane of the contact regions 48 is not necessarily horizontal and is largely dependent on the way the probes 46 are formed, the way in which the probe card backing member 44 is secured to the mounting plate 50, and the way in which the mounting plate 50 is secured to the shelf 40. Other factors may also influence the positioning and orientation of the plane in which the contact regions 48 are located. Suffice to say that the plane in which the contact regions 48 are located is largely indeterminate after the mounting plate 50 is secured to the shelf 40.

Figure 2:
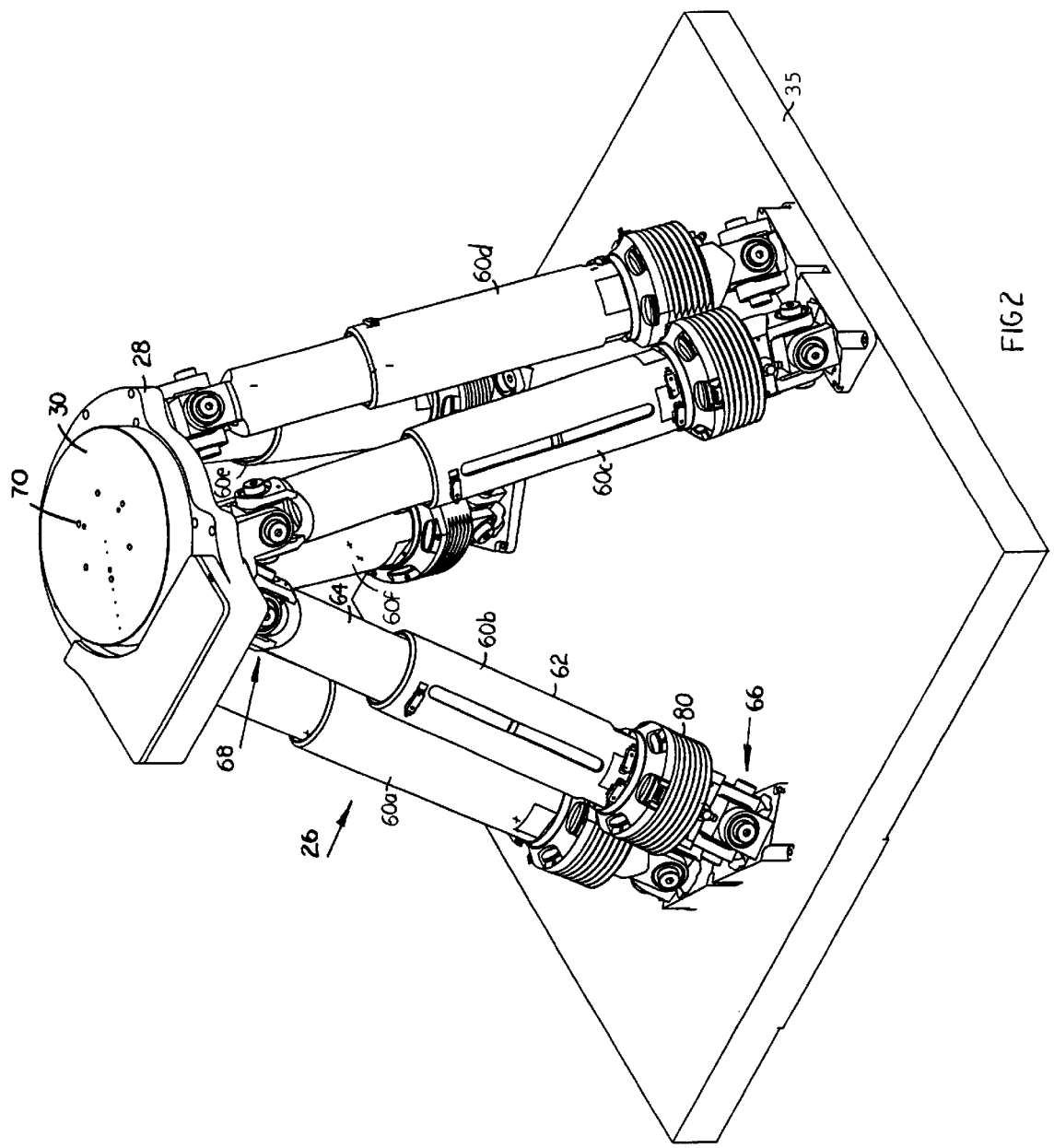
FIG. 2 is a perspective view of a base plate, a hexapodal mounting arrangement, a support plate, and a holder forming part of the apparatus of FIG. 1.
Figure 3:
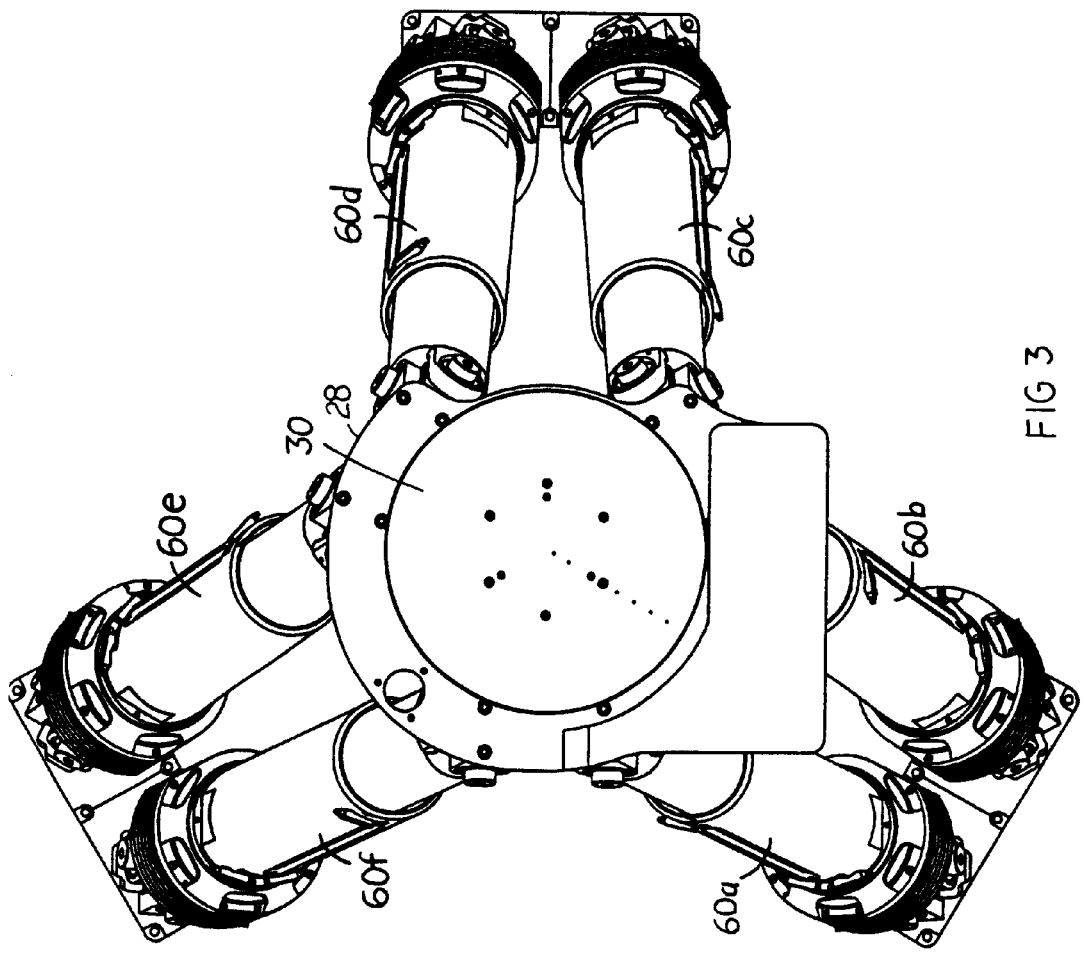
FIG. 3 is a plan view of the components shown in FIG. 2.

FIG. 2 and FIG. 3 illustrate the base plate 35, the mounting arrangement 26, the support plate 28, and the holder 30 in more detail. The mounting arrangement 26 includes a first extensible arm to a sixth extensible arm, 60a to 60f respectively. Each extensible arm 60 includes a tubular member 62 and an elongate member 64 which is located within the tubular member 62. The elongate member can be extended from and retracted into the tubular member 62.

A lower end of the tubular member 62 is mounted to the base plate 35 by means of a universal joint 66. The universal joint 66 allows for pivoting of the tubular member 62 relative to the base plate 35 in all directions. Each tubular member 62 of each extensible arm 60 is mounted to the base plate 35 in a similar manner.

An upper end of each elongate member 64 is mounted to the support plate 28 by means of a universal joint 68. The support plate 28 can thus pivot to relative to the elongate member 64 in all directions.

The holder 30 is secured on top of the support plate 28. The holder 30 includes a number of suction passages 70. Lower ends of the suction passages 70 can be connected to a vacuum pump (not shown). A substrate such as a wafer can be located on top of the holder 30. The vacuum pump can then be switched on so that air flows through the suction passages 70 and a vacuum is created on a lower surface of the wafer. The vacuum ensures nonslip engagement between the wafer and the holder 30.

Lower ends of the first and second extensible arms 60a and 60b are located next to one another. Lower ends of the third and fourth extensible arms 60c and 60d are located next to one another. Lower ends of the fifth and sixth extensible arms 60e and 60f are located next to one another. Upper ends of the second and third extensible arms 60b and 60c are located next to one another. Upper ends of the fourth and fifth extensible arms 60d and 60e are located next to one another. Upper ends of the sixth and first extensible arms 60f and 60a are located next to one another. The upper ends of the extensible arms 60a to 60f are on average located closer to one another than lower ends of the extensible arms 60a to 60f.

A wafer located on the holder 30 can be moved by extending or retracting the elongate members 64 of the extensible arms 60a to 60f. By selectively extending or retracting selected ones of the elongate members 64, the wafer can be moved in any desired plane or about any desired axis. FIG. 4 to FIG. 7 illustrate examples of how the wafer can be moved by selectively extending or retracting selected ones of the elongate members 64.

FIG. 4 illustrates one example of how the wafer can be pivoted about a horizontal axis. The elongate members of the third and fourth extensible arms 60c and 60d are retracted while the elongate members of the first, second, fifth and sixth extensible arms 60a, 60b, 60e, and 60f remain stationary. The wafer pivots about a horizontal axis 72. The horizontal axis 72 extends from the upper ends of the first and second extensible arms 60a and 60b to upper ends of the fifth and sixth extensible arms 60e and 60f.

In a similar manner, for example, the elongate members of the first and second extensible arms 60a and 60b can be retracted while the elongate members of the third, fourth, fifth, and sixth extensible arms 60c, 60d, 60e, and 60f remain stationary. The wafer will then pivot about a horizontal axis 72A extending from near upper ends of the third and fourth extensible arms 60c and 60d to near upper ends of the fifth and sixth extensible arms 60e and 60f. By selectively extending or retracting selected ones of the elongate members of the extensible arms 60a to 60f, the wafer can therefore be pivoted about any horizontal axis, located transversely relative to one another, so that a plane of the wafer can be moved to any desired orientation relative to a horizontal plane.

FIG. 5 illustrates how the wafer can be rotated. The wafer is rotated by retracting the elongate members of the first, third, and fifth extensible arms 60a, 60c, and 60e, while extending the elongate members of the second, fourth, and sixth extensible arms 60b, 60d, and 60f. The wafer rotates about a vertical axis 74 without necessarily pivoting about any horizontal axis or movement in any other direction.

FIG. 6 illustrates how the wafer can be moved in a horizontal direction. The elongate members of the first, second, fifth, and sixth extensible arms 60a, 60b, 60e, and 60f are extended while the elongate members of the third and fourth extensible arms 60c and 60d are retracted. The wafer moves in a horizontal direction 76. The direction is from between the first and sixth extensible arms 60a and 60f to between the third and fourth extensible arms 60c and 60d.

The wafer can be moved in any other direction as required. For example, the elongate members of the first and second extensible arms 60a and 60b can be retracted while the elongate members of the third, fourth, fifth, and sixth extensible arms 60c, 60d, 60e, and 60f are retracted. The wafer will then move in a horizontal direction from between the first and second extensible arms 60a and 60b to between the fourth and fifth extensible arms 60d and 60e. The wafer can thus be moved in any desired direction, located transversely relative to one another, in a plane of the wafer without necessarily rotating the wafer about a vertical axis or pivoting the wafer about a horizontal axis.

FIG. 7 illustrates how the wafer can be elevated or lowered. The elongate members of all the extensible arms 60a to 60f are extended to cause movement of the wafer in an upward direction 78. By retracting the elongate members of all the extensible arms 60a to 60f, the wafer can be lowered.

FIG. 4, FIG. 5, FIG. 6, and FIG. 7 illustrate only some examples of how the wafer can be moved. In addition, it should be understood that any combination of the movements discussed with reference to FIG. 4, FIG. 5, FIG. 6, and FIG. 7 is also possible.

FIG. 8 and FIG. 9 illustrate one of the extensible arms 60 in more detail. In addition to the tubular member 62 and the elongate member 64, the extensible arm 60 also includes a motor housing 80, an electric motor 82 located within the motor housing, a threaded spindle 84, a bearing nut 86, an apparatus 88 for detecting rotation of the threaded spindle 84.

An end of the tubular member 62 is secured to the motor housing which, in turn, is secured to the universal joint 66. The electric motor 82 includes a stator 92 and a rotor 94 located within the stator 92. The rotor 94 can be rotated by supplying electric power to the stator 92.

The threaded spindle 84 has one end that is secured to the rotor 94 and rotates together with the rotor 94. The nut 86 is mounted to the tubular member 62 for sliding movement along the tubular member 62 without rotation. The threaded spindle 84 and the nut 86 are in a ballscrew arrangement. The threaded spindle 84 has thread on an outer surface thereof and the nut 86 has ball bearings (not shown) on a inner surface thereof. When the threaded spindle 84 rotates, the thread on the outer surface thereof rolls on the ball bearings on the inner surface of the nut 86 and causes movement of the nut 86 along the tubular member 62. An end of the elongate member 64 is secured to the nut 86 so that the elongate member 64 extends from or retracts into the tubular member 62 when the nut 86 moves along the tubular member 62. When one voltage is supplied to the stator 92, the elongate member 64 extends from the tubular member 62 and when the voltage is reversed, the elongate member 64 retracts into the tubular member 62.

Because of a screw engagement between the threaded spindle 84 and the nut 86, rotation of the rotor 94 translates into very exact translation of the elongate member 64 relative to the tubular member 62 (as opposed to, for example, the use of pneumatics or hydraulics).

The apparatus 88 includes a disk 100 and a detector 102 which is located adjacent to the disk 100. The disk 100 is secured to and revolves together with the threaded spindle 84. The detector 102 is located next to an edge of the disk 100. Markings (not shown) are formed around an edge of the disk 100 which can be detected by the detector 102. Each time a marking is detected by the detector 102 a signal is sent to a controller 110. The signal sent by the detector 102 to the controller 110 is indicative of rotation of the disk 100 and the threaded spindle 84, and therefore also indicative of extension or retraction of the elongate member 64 out of or into the tubular member 62.

The controller 110 controls a power supply 112 which supplies power to the stator 92. By controlling power supplied to the stator 92, the controller can make the elongate member 64 extend out of or retract into the tubular member 62. Because of feedback from the detector 102, the controller can switch the power supply 112 off when the elongate member 64 has extended or retracted by a certain predetermined distance.

FIG. 10 illustrates the arrangement of the controller 110 together with a power supply 112a to 112f and a respective extensible arm 60a to 60f.

The controller 110 is typically a computer. A software program provided on a computer readable medium such as a disk is loaded into memory into the computer. The program is executable from memory by a processor of the computer.

The controller is connected to the power supplies 112a to 112f by a serial port, universal serial bus, firewire or any other communication channel. The controller 110 can control a respective one of the power supplies 112a to 112f independently from another. A respective one of the power supplies 112a to 112f provides power to a respective one of the extensible arms 60a to 60f. Each extensible arm has a respective detector (102 in FIG. 9) which provides feedback to the controller 110.

The controller 110 also receives input from the probe card camera 34 and the substrate camera 36. The controller 110 is connected to cameras by a serial port, universal serial bus, firewire or any other communication channel. Referring again to FIG. 1, the probe card camera 34 is secured to the support plate 28. The mounting arrangement 26 can be operated so that the probe card camera 34 moves to respective ones of the probes 46. The probe card camera 34 can then detect the positioning of a respective contact region 48 of respective ones of the probes 46. Utilizing autofocus and other techniques, the probe card camera 34 can also measure the distance from the probe card camera 34 to a respective one of the contact regions 48. The exact coordinates of each contact region 48 can therefore be determined in three dimensional space. The coordinates of each contact region 48 is provided to the controller 110. If the location in three dimensional space of each contact region 48 can be determined, the controller can calculate a plane in which the contact regions 48 of the probes 46 are located. The locations of the contact regions 48 and the plane of the contact regions 48 is determined relative to the positioning of the probe card camera 34. Details of the probe card camera 34 and how a plane is determined can be found in the specification of U.S. Pat. No. 6,096,567 issued on Aug. 1, 2000 and assigned to the assignee of the present application and incorporated herein by reference.

The substrate camera 36 is mounted to a boom 116. The boom 116 is mounted to the frame 22 for pivotal movement in a horizontal plane. Once a wafer (or other substrate) is located on the holder 30, the substrate camera 36 is swept over the wafer by pivoting the boom 116 relative to the frame 22. The wafer typically has a plurality to the terminals on a surface thereof. The substrate camera 36 operates the same as the probe card camera 34 in that the substrate camera 36 determines the positioning of each one of a number of the terminals in three dimensional space, and provides the coordinates of the terminals to the controller 110. The controller 110 can then determine the plane, or at least an approximate plane, in which the terminals are located. The locations in three dimensional space of the terminals and the plane of the terminals are determined relative to the location of the substrate camera 36.

A detector 118 detects the pivotal positioning of the boom 116 and provides feedback to the controller 110 of the exact positioning of the boom 116. Because the boom 116 is mounted to the frame 22 and the detector 118 detects the pivotal position of the boom 116, the positioning of the substrate camera 36 can thus be determined with respect to the frame 22.

The probe card camera 34 is initially aligned with the substrate camera 36 for calibration purposes. When the probe card camera 34 is detected by the substrate camera 36, the positioning of the probe card camera 34 and the substrate camera 36 can be determined relative to one another. Because the absolute positioning of the substrate camera 36 relative to the frame 22 is known, the absolute positioning of the probe card camera 34 relative to the frame 22 is also known. The absolute positioning of the contact regions 48 and the plane of the contact regions 48 (as detected by the probe card camera 34), and the absolute positioning of the terminals of the wafer and the plane of the terminals (as detected by the substrate camera 36) relative to the frame 22 to are therefore also known by the controller 110. The controller 110 can then calculate the position of the terminals and the contact regions 48 relative to one another and control the mounting arrangement 26 by moving the wafer so that the terminals are in required locations relative to the contact regions 48.

FIG. 11 to FIG. 17 illustrate how a wafer can be moved.

Figure 11:
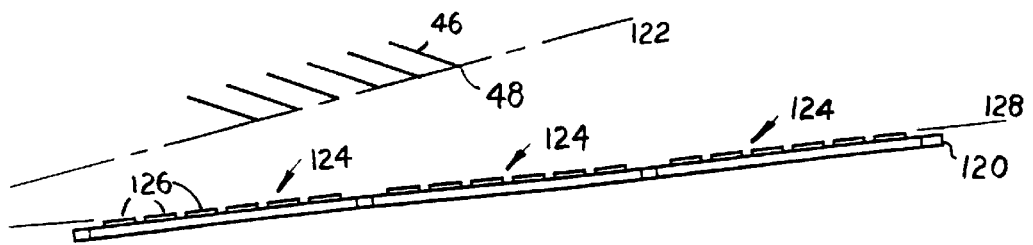
FIG. 11 is a side view of probes forming part of the apparatus and a wafer having a plurality of terminals.

FIG. 11 illustrates the probes 46 and a wafer 120. The contact regions 48 of the probes 46 are located in a first plane 122. The wafer 120 has a plurality of dice 124. The dice 124 are arranged in rows and columns. Each die 124 has a plurality of contact terminals 126 on a surface thereof. The contact terminals 126 of the dice 124 are located in a second plane 128.

The wafer 120 is then moved so that respective one of the contact regions 48 are located over the respective ones of the terminals 126 of one of the dice 124. The wafer is then rotated, pivoted as shown in FIG. 12, and moved in a plane of the wafer 120 as shown in FIG. 13.

Rotation of the wafer is described hereinbefore with reference to FIG. 5. Rotation of the wafer 120 ensures that the contact regions 48 are not rotationally misaligned with the terminals 126.

Figure 12:
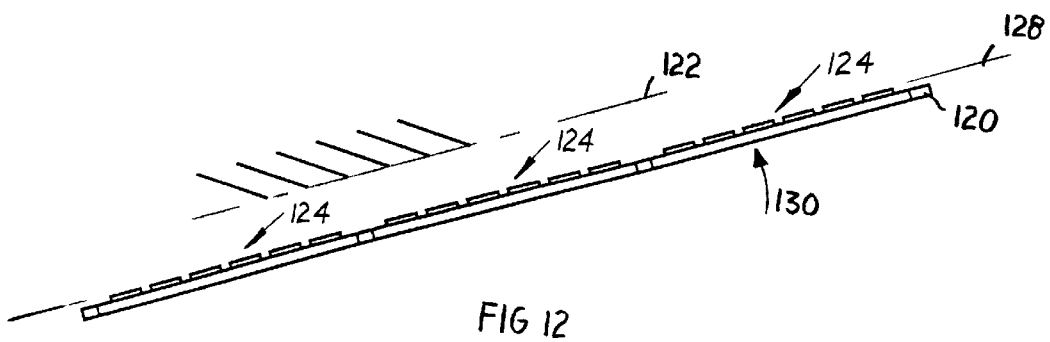
FIG. 12 is a view similar to FIG. 11 after the wafer is pivoted about at least one horizontal axis.

Referring now to FIG. 12, the wafer 120 is then pivoted in a direction 130 so that the first and second planes 122 and 128 are parallel to one another. Pivoting of the wafer 120 should be evident from the description hereinbefore with reference to FIG. 4. It should therefore be understood that the first and second planes 122 and 128 are parallel to one another in all directions.

Figure 13:
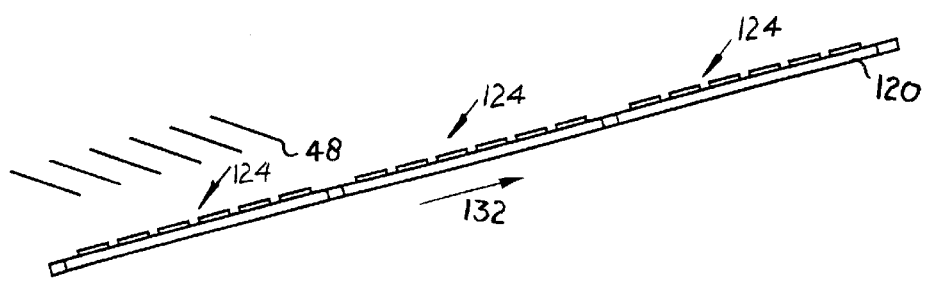
FIG. 13 is a view similar to FIG. 12 after the wafer is moved in a plane of the wafer.

As shown in FIG. 13, the wafer 120 is then moved in a direction 132 which is in a plane of the wafer 120. As discussed with reference to FIG. 6, the wafer 120 can be moved in any direction in a plane of the wafer 120. The contact regions 48 can therefore be aligned with terminals 126 on a selected one of the dice 124 which are located in row and columns on the wafer 120. The contact regions 48 are equidistantly spaced from the terminals 126.

Figure 14:
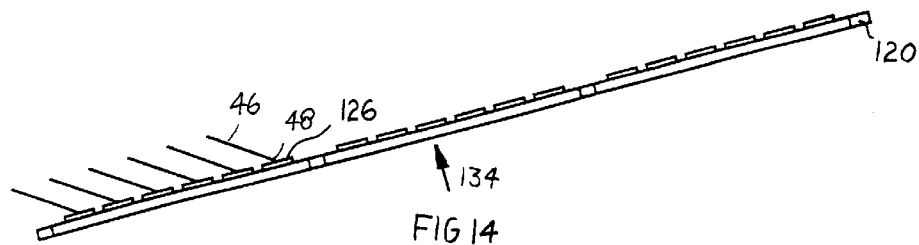
FIG. 14 is a view similar to FIG. 13 after the wafer is moved towards the probes.

As shown in FIG. 14, the wafer 120 is then moved in a direction 134 so that a respective one of the terminals 126 contacts a respective one of the contact regions. The controller 110 controls extension of the extensible arms 60a to 60f so that the planes 122 and 128 remain parallel to one another while the wafer 120 moves towards the probes 46. The terminals 126 therefore contact all of the contact regions 48 at substantially the same moment in time. The wafer 120 is then further moved in the direction 134 to cause deflection of the contact regions 48 against spring action of the probes 46. While so being moved, the plane 128 of the terminals 126 is maintained in its original orientation by the controller 110. Because the plane of the terminals 126 is originally parallel to the plane of the contact regions 48, and maintained in such an orientation, an equal amount of pressure is applied by each contact region 48 to a respective terminal 126. Proper contact between the terminals 126 and the contact regions 48 is ensured.

The electrical tester 32 can then provide electrical signals through the electrical wires 52 and the probes 46 to the terminals 126. The terminals 126 are connected to an integrated circuit of semiconductor electronic devices in the wafer 120. Signals can also be provided by the integrated circuit through the terminals 126 and the probes 46 to the electrical tester 32. The electrical tester 32 can thus test the integrated circuit in the die 124.

Figure 15:
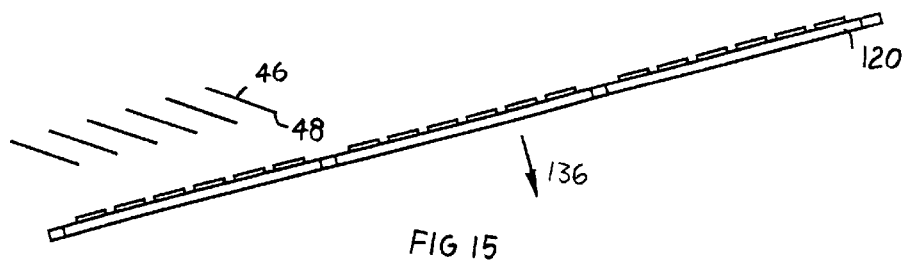
FIG. 15 is a view similar to FIG. 14 after the wafer is moved away from the probes.
Figure 16:
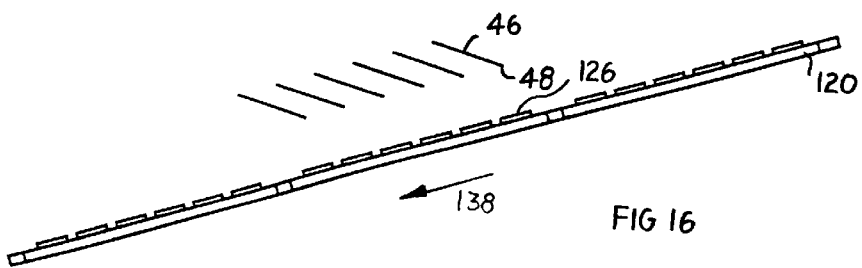
FIG. 16 is a view similar to FIG. 14 after the wafer is moved so that another one of a number of dice of the wafer is aligned with the probe.
Figure 17:
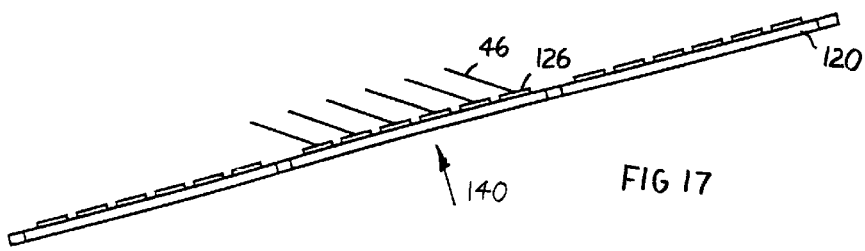
FIG. 17 is a view similar to FIG. 16 after the wafer is moved towards the probes.

As shown in FIG. 15, the wafer can then be moved in a direction 136 so that the terminals 126 are again spaced from the contact regions 48.

The wafer 120 is then moved in a direction 138 so that the contact regions 48 are aligned with terminals 126 on another one of the dice 124 in the same row as the die which was tested in FIG. 14.

As shown in FIG. 17, the wafer 120 can again be moved so that the terminals 126 of the die 124 is brought into contact with the contact regions 48 for purposes of testing the die 124.

The process as shown in FIG. 14 to FIG. 17 can be repeated until each die in a row is tested. The wafer 120 can then be moved so that the contact regions 48 are aligned with a die in another column. All the dice in the new column can then be tested in a similar manner, whereafter dice in a further column can be tested, and so on.

It can be seen from the aforegoing description that the apparatus 20 provides probing of a substrate wherein a plane of contact regions of probes is automatically adjusted to be substantially parallel to a plane of terminals on a substrate, or "planarized" relative to one another. Proper, uniform contact is ensured between the probes and the terminals. Such a feature is very useful for an efficient, fast setup, especially when types of probe cards and substrates are continually being interchanged, and for continually re-adjusting planarity as needed. Further, the co-planarity of the two planes (e.g. how close to being parallel the two planes are) or the height of each extensible arm may be monitored during a probing operation (e.g. while a force from a probe card is pressing against the wafer) and each extensible arm may be adjusted automatically during the probing operation in order to keep both planes substantially parallel to each other. That is, the planes may be kept substantially parallel while the one plane is caused to be pressed toward the other plane (e.g. the plane of probes is pressed onto the wafer's surface).

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art. For example, it may be possible for upper ends of extensible arms of a hexapodal mounting arrangement to extend upwardly past a holder for a substrate and connect to a probe card. The probe card can then be moved by the extensible arms instead of the holder. Retraction of the extensible arms will cause engagement between probes of the probe card and terminals on the substrate. In another embodiment it may also be possible to hang a probe card from a hexapodal mounting arrangement. Extension of the arms of the mounting arrangement will cause engagement between probes of the probe card and terminals on a substrate. It may also be possible for a holder to be at the top and a probe card to be at the bottom. One skilled in the art would appreciate from the teachings of the aforegoing description that other arrangements are also possible. One skilled in the art would however also appreciate the benefits of the present invention, in particular in that the probe card is stationary because of connection to the electrical tester, and that the holder is at the bottom for more convenient handling of a substrate.

What is claimed:

1. An apparatus for testing a substrate having a plurality of terminals, comprising:
   a frame;
   a first arrangement secured to the frame;
   a mounting arrangement secured to the frame;
   a second arrangement secured to the mounting arrangement, the first or second arrangement being a holder capable of holding the substrate so that the terminals are located in a first plane, and the other one of the first and second arrangements being a probe card backing member and a plurality of probes extending from the probe card backing member, the probes having contact regions located in a second plane, wherein:
   (i) the mounting apparatus includes at least a first member which is adjustable relative to the frame so as to pivot the second arrangement by pivotal movement relative to the first arrangement between an orientation wherein there is an angle between the first and second planes and an orientation wherein the first and second planes are substantially parallel to one another; and
   (ii) the second arrangement being movable by translational movement, independent of the pivotal movement, relative to the frame between a position wherein the contact regions are spaced from the terminals and a position wherein each contact region contacts a respective one of the terminals.

2. An apparatus according to claim 1 further comprising:
   a controller which receives a signal indicating an orientation of the first plane while the second arrangement is moved towards the position wherein each contact region contacts a respective one of the terminals, and controls the first member so as to maintain the orientation of the first plane parallel to the orientation of the second plane while the second arrangement is moved towards the position wherein each contact region contacts a respective one of the terminals.

3. An apparatus according to claim 1 wherein the second arrangement pivots about a first axis and the mounting apparatus includes at least a second member which is adjustable relative to the frame so as to pivot the second arrangement relative to the first arrangement, about a second axis which is at an angle relative to the first axis, between an orientation wherein there is an angle between the first and second planes and an orientation wherein the first and second planes are substantially parallel to one another.

4. An apparatus according to claim 1 further comprising:
   a member which is adjustable so as to rotate the second arrangement relative to the first arrangement without changing the angle between the first and second planes.

5. An apparatus according to claim 1 wherein the mounting apparatus moves the second arrangement towards the first arrangement so as to bring the contact regions into contact with the terminals.

6. An apparatus according to claim 1 further comprising:
   an electrical tester within communication with the probes so as to be capable of testing the substrate by providing electrical signals through the probes and the terminals to the substrate.

7. An apparatus according to claim 1 further comprising:

at least one detector capable of detecting the location of the first plane, and capable of detecting the location of the second plane; and a controller which receives information from the detector of the locations of the first and second planes, the controller being capable of adjusting the first member relative to the frame so as to adjust the first and second planes relative to one another between the orientation wherein there is an angle between the first and second planes and the orientation wherein the first and second planes are substantially parallel.

8. An apparatus according to claim 1 wherein the first arrangement is the probe card and the second arrangement is the holder.

9. An apparatus for testing a substrate having a plurality of terminals, comprising:

a frame;

a probe card secured to the frame, the probe card having a probe card backing member and a plurality of probes extending from the probe card backing member, the probes having contact regions located in a first plane;

a mounting arrangement secured to the frame;

a holder secured to the mounting arrangement, the holder being capable of holding the substrate so that the terminals are located in a second plane, wherein:

(i) the mounting arrangement includes at least a first member which is adjustable relative to the frame so as to pivot the holder relative to the frame between a first orientation wherein there is an angle between the first and second planes and an orientation wherein the first and second planes are substantially parallel to one another; and (ii) the probe card and the holder are movable relative to one another between a position wherein the contact regions are spaced from the terminals and a position wherein each contact region contacts a respective one of the terminals.

10. The apparatus of claim 9 wherein the holder is movable relative to the frame between the position wherein the contact regions are spaced from the terminals and the position wherein each contact region contacts a respective one of the terminals.

11. An apparatus for testing a substrate having a plurality of terminals, comprising:

a frame;

a first arrangement secured to the frame;

a plurality of members secured to the frame each member being adjustable relative to the frame; and a second arrangement secured to the members, the first or second arrangement being a holder capable of holding the substrate so that the terminals are located in a first plane, and the other one of the first and second arrangements being a probe card including a probe card backing member and a plurality of probes extending from the probe card backing member, the probes having contact regions located in a second plane, wherein the members are selectively adjustable so as to be capable of:

(i) pivoting the second arrangement about a first axis between an orientation wherein there is an angle between the first and second planes and an orientation wherein the first and second planes are substantially parallel to one another;

(ii) pivoting the second arrangement about a second axis, which is at an angle relative to the first axis, between an orientation wherein there is an angle between the first and second planes and an orientation wherein the first and second planes are substantially parallel to one another;

(iii) rotating the second arrangement without changing an angle between the planes;

(iv) moving the second arrangement so that the first and second planes move past one another in a first direction;

(v) moving the second arrangement so that the first and second planes move past one another in a second direction which is transverse to the first direction; and (vi) moving the second arrangement towards and away from the first arrangement without changing an angle between the planes.

12. An apparatus according to claim 11 wherein each member is an extensible arm.

13. An apparatus according to claim 12 comprising at least six of the extensible arms.

14. An apparatus according to claim 13 wherein extension of all the arms causes movement of the second arrangement towards the first arrangement.

15. An apparatus according to claim 11 wherein the first arrangement is the probe card and the second arrangement is the holder.

16. An apparatus according to claim 11 further comprising:

an electrical tester within communication with the probes so as to be capable of testing the substrate by providing electrical signals through the probes and the terminals to the substrate.

17. An apparatus according to claim 11 further comprising:

at least one detector capable of deleting the location of the first plane and detecting the location of the second plane, a controller which receives information from the detector of the locations of the first and second planes, the controller being capable of adjusting the first member relative to the frame so as to adjust the first and second planes relative to one another between the orientation wherein there is an angle between the first and second planes and the orientation wherein the first and second planes are substantially parallel.

18. An apparatus for testing a substrate having a plurality of terminals, comprising:

a frame;

a first arrangement secured to the frame;

six extensible arms, each arm having a first end secured to the frame for pivotal movement in more than one direction;

a second arrangement secured to second ends, opposing the first ends of each of the six extensible arms, for pivotal movement in more than one direction relative to each respective arm, the first arrangement or the second arrangement being a holder capable of holding the substrate and the other one of the first arrangement and the second arrangement being a probe card including a probe card backing member and a plurality of probes extending from the backing member wherein the members are selectively adjustable so as to be capable of moving the second arrangement relative to the first arrangement, the first and second arrangement being movable relative to one another between a position wherein contact regions of the probes are spaced from the terminals, and a position wherein each one of the contact regions contacts a respective one of the terminals.

19. An apparatus for testing a substrate having a plurality of terminals, comprising:

a frame;

a first arrangement secured to the frame;

six extensible arms, each arm having a first end secured to the frame for pivotal movement in more than one direction;

a second arrangement secured to second ends, opposing the first ends, of each of the six extensible arms, for pivotal movement in more than one direction relative to each respective arm, the first arrangement or the second arrangement being a holder capable of holding the substrate so that the terminals are located in a first plane, and the other one of the first and second arrangements being a probe card including a probe card backing member and a plurality of probes extending from the backing member, the probes having contact regions located in a second plane, wherein the members are selectively adjustable so as to be capable of:

(i) pivoting the second arrangement about a first axis between an orientation wherein there is an angle between the first and second planes and an orientation wherein the first and second planes are substantially parallel to one another;

(ii) pivoting the second arrangement about a second axis, which is at an angle relative to the first axis, between an orientation wherein there is an angle between the first and second planes and an orientation wherein the first and second planes are substantially parallel to one another;

(iii) rotating the second arrangement without changing an angle between the planes;

(iv) moving the second arrangement so that the first and second planes move past one another in a first direction;

(v) moving the second arrangement so that the first and second planes move past one another in a second direction which is transverse to the first direction; and (vi) moving the second arrangement towards and away from the first arrangement without changing an angle between the planes;

at least one detector capable of detecting the location of the first plane and the location of the second plane;

a controller receiving data from the detector of the location of the first and second planes, the controller being capable of controlling the six extensible arms so that the extensible arms:

(i) pivot the second arrangement so as to position the first and second planes parallel to one another;

(ii) rotate the first and second planes relative to one another;

(iii) move the first and second planes past one another so as to position a selected group of the terminals over the probes, the rotation ensuring alignment between selected ones of the probes and selected ones of the terminals, and the pivoting ensuring that the probes are substantially equidistantly spaced from the terminals; and (iv) move the first and second planes toward one another so that a respective one of the contact regions contacts a respective one of the terminals.

20. A method of testing a substrate having a plurality of terminals, comprising:

moving a member thereby pivoting a probe card and the substrate relative to one another between an orientation wherein there is an angle between a first plane in which contact regions of probes of a probe card are located and a second plane in which the terminal are located, and an orientation wherein the first and second planes are substantially parallel to one another; and again moving the member thereby moving the probe card and the substrate towards one another until each contact region contacts a respective one of the terminals.

21. A method according to claim 20 further comprising:
rotating the probe card and the substrate relative to one another.

22. A method according to claim 21 wherein the probe card and the substrate are rotated relative to one another without changing an angle between the planes.

23. A method according to claim 20 further comprising:
moving the probe card and the substrate past one another in a first direction.

24. A method according to claim 23 further comprising:
moving the probe card and the substrate past one another in a second direction which is transverse to the first direction.

* * * * *